(12) United States Patent
Fry et al.

(10) Patent No.: US 6,570,461 B1
(45) Date of Patent: May 27, 2003

(54) TRIM EFFECT COMPENSATION CIRCUIT

(75) Inventors: Steven J. Fry, Carlisle, PA (US);
Raymond M. Carlisle, Loysville, PA (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/990,642

(22) Filed: Nov. 21, 2001

(51) Int. Cl.[7] .................................................. H03L 1/00
(52) U.S. Cl. ........................ 331/176; 331/66; 331/158; 331/177 R
(58) Field of Search ................................ 331/176, 158, 331/177 R, 66

(56) References Cited

U.S. PATENT DOCUMENTS

| | | |
|---|---|---|
| 3,322,981 A | 5/1967 | Brenig |
| 3,831,111 A | 8/1974 | Lafferty |
| 3,970,966 A * | 7/1976 | Keller et al. ............ 331/116 R |
| 4,020,426 A | 4/1977 | Helle |
| 4,072,912 A | 2/1978 | Pradal |
| 4,096,451 A | 6/1978 | Pradal |
| 4,412,188 A | 10/1983 | Helle |
| 4,456,892 A | 6/1984 | Vandergraaf |
| 4,607,237 A | 8/1986 | Aota |
| 4,851,791 A | 7/1989 | Marotel |
| 4,951,007 A | 8/1990 | Kosinski |
| 5,004,988 A | 4/1991 | Ueno |
| 5,041,799 A | 8/1991 | Pirez |
| 5,428,319 A * | 6/1995 | Marvin et al. .......... 331/116 R |
| 5,473,289 A | 12/1995 | Ishizaki |
| 5,537,049 A | 7/1996 | Oita |
| 5,668,506 A | 9/1997 | Watanabe |
| 5,731,742 A | 3/1998 | Wojewoda |
| 5,781,075 A | 7/1998 | Bolton, Jr. |
| 5,999,063 A | 12/1999 | Sakurai |
| 6,040,744 A | 3/2000 | Sakurai |
| 6,292,066 B1 | 9/2001 | Shibuya |

OTHER PUBLICATIONS

D.E. Newell and H. Hinnah, "Automatic Compensation Equipment for TCXO's", Proceeding of the 22nd Frequency Control Symposium, 1968, pp. 298–310.

D.E. Newell and R. H. Bangert "Temperature Compensation of Quartz Crystal Oscillators", Proceedings of the 17th Grequency Control Symposium, 1963, pp. 491–507.

M/ Frerking, "10 Temperature Compensation", Van Nostrand Reinhold Co., 1978, pp. 130–176.

* cited by examiner

Primary Examiner—Robert Pascal
Assistant Examiner—Kimberly E Glenn
(74) Attorney, Agent, or Firm—Mark P. Bourgeois (57) ABSTRACT

An oscillator assembly has a voltage controlled crystal oscillator that produces a stable reference frequency. The voltage controlled crystal oscillator is connected to an electronic frequency adjust voltage. A temperature compensation circuit is connected to the voltage controlled crystal oscillator. The temperature compensation circuit provides a temperature compensation voltage to the voltage controlled crystal oscillator. A trim effect compensation circuit is connected between the temperature compensation circuit and the electronic frequency adjust voltage. The trim effect compensation circuit adjusts the temperature compensation voltage in response to a change in the electronic frequency adjust voltage.

13 Claims, 6 Drawing Sheets

TRIM EFFECT COMPENSATION CIRCUIT

CROSS REFERENCE TO RELATED APPLICATIONS

This application is related to U.S. patent application Ser. No. 09/335,245, filed , Jun. 17, 1999, and titled, "Temperature Compensating Circuit for a Crystal Oscillator". The contents of which are herein incorporated by reference in entirety.

BACKGROUND

1. Field of the Invention

This invention relates to an oscillator that provides a stable reference frequency signal in electronic equipment. Specifically, there is an oscillator that has a trim effect compensation circuit to compensate for error in the frequency versus temperature curve which results when a temperature compensated crystal oscillator is adjusted or trimmed to correct for frequency drift due to aging.

2. Description of Related Art

Temperature Compensated Crystal Oscillators (TCXO's) which employ thermistor/resistor networks have been in existence for some 45 years. These networks operate on the principle of producing a precisely calibrated, temperature varying correction voltage. When this voltage is applied to the tuning port of a voltage controlled crystal oscillator, it exactly cancels the inherent frequency vs. temperature drift of the quartz crystal and oscillator components.

When the frequency of the crystal drifts over time due to aging effects, it is usually necessary to trim the frequency back to nominal by adjusting some reactance in the oscillator circuit which shifts the operating point of the crystal. This is accomplished either by changing the setting of a mechanically variable capacitor or by adjusting the bias voltage to a variable capacitance varactor diode. This bias voltage is called an electronic frequency adjust (EFA) or control voltage and is a conventionally available terminal for connection to an external voltage on many commercially available temperature compensated crystal oscillators. When the EFA voltage is changed, however, the pulling sensitivity of the circuit is also affected. This means that the exact same temperature compensating voltage from the network will have a slightly different effect on the frequency over temperature, resulting in a rotation of the temperature versus frequency curve which degrades the temperature error. The further the frequency has been adjusted or pulled, the greater the magnitude of the error. This error that results after trimming the frequency back to nominal to compensate for aging has become known as the "Trim Effect Error."

Figure 1:
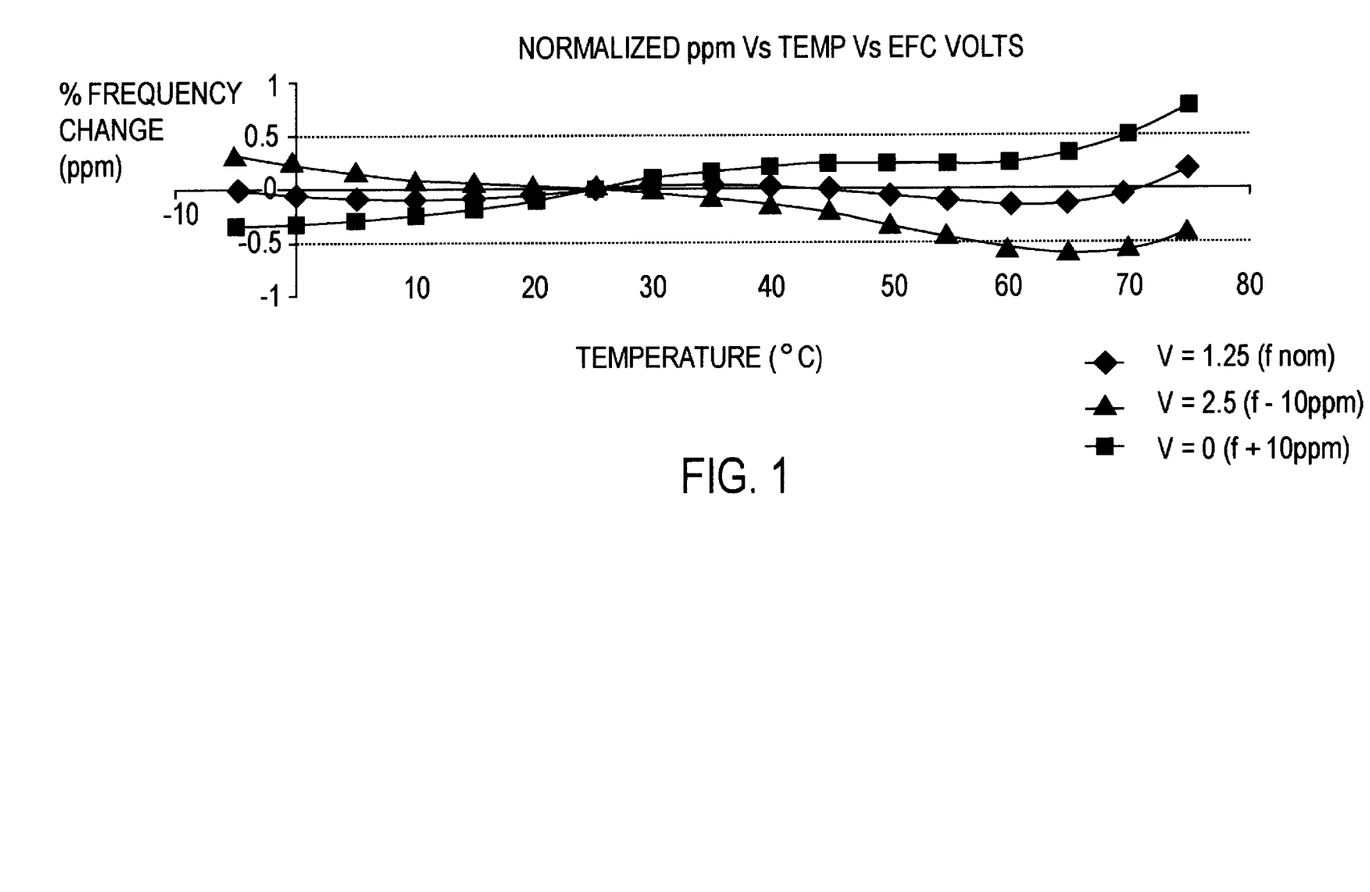
FIG. 1 is a graph of trim effect error for a prior art oscillator.

Trim effect error has always been a problem with TCXO's. Although there are some circuit configurations and techniques which can minimize the effect, there is no way to avoid the problem. For lower tolerance units, this is not a major issue, but as tighter compensation stabilities are required, this trim effect error can become a significant portion of the overall frequency tolerance. FIG. 1 illustrates the typical curve rotation that occurs when a precision TCXO is trimmed to its maximum and minimum frequencies. FIG. 1 shows a graph of percent frequency change in parts per million versus temperature in degrees Celsius for 3 different voltages of electronic frequency adjust, 0, 1.25 and 2.5 volts. The graph shows the frequency shift about the nominal frequency of +10 ppm, 0 and −10 ppm. The graph is normalized about 25 degrees Celsius. With some telecom systems requiring compensation to a level of better than ±0.3 ppm to achieve Stratum 3 holdover requirements, the trim effect is a limitation in these types of TCXO applications.

Figure 2:
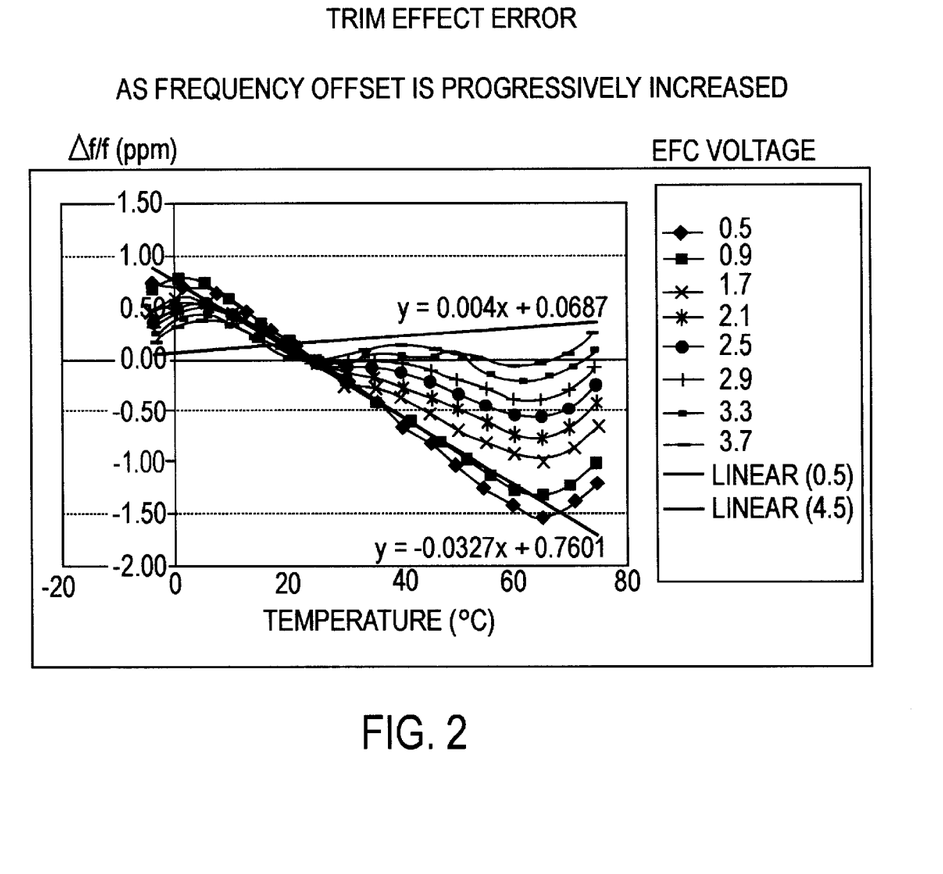
FIG. 2 is a graph of trim effect error for a prior art oscillator showing rotation of the frequency vs. temperature curve.

FIG. 2 shows the typical rotation of the frequency vs. temperature characteristic of a standard TCXO that occurs as the center frequency is incrementally trimmed + and − about 12 ppm from nominal. It can be seen that the slope of the entire curve is progressively skewed as the amount of shift is increased or decreased. A straight line can be fit through each curve resulting in a linear function.

Figure 3:
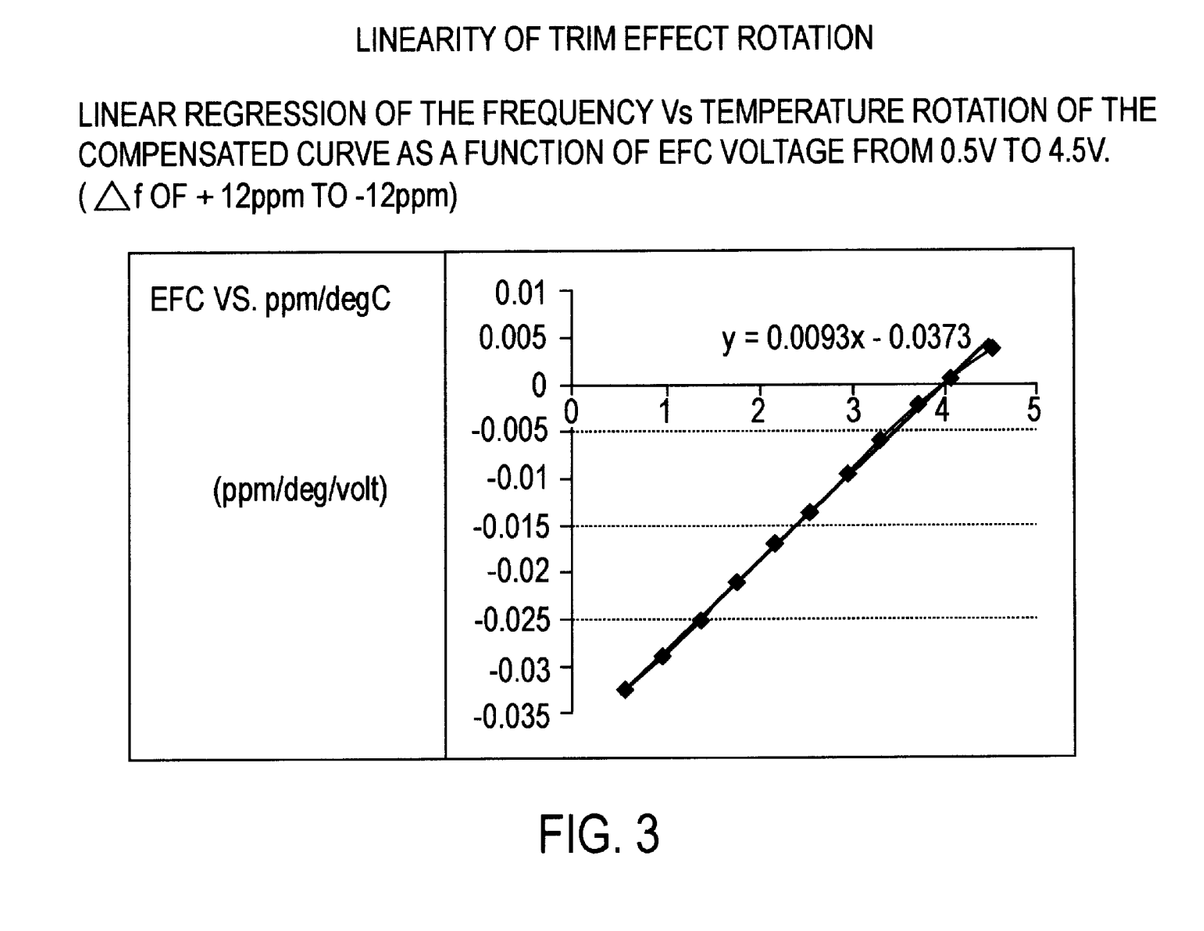
FIG. 3 is a linear regression fit through each curve of FIG. 2 with the slopes of the lines plotted vs. the tuning voltage.

Turning to FIG. 3, a graph of the linearity of trim effect rotation is shown, if a straight line is fit through each of the curves of FIG. 2 and the slopes of the lines are plotted vs. the tuning voltage, (which is proportional to the amount of frequency shift or trim), it can be seen that a very linear, well behaved function is obtained. FIG. 3 is a linear regression of the frequency versus temperature rotation as a function of electronic frequency adjust voltage form 0.5 to 4.5 volts. The y-axis has units of ppm/degree/volt. The x-axis has units of volts of electronic frequency adjust.

A current unmet need exists for an oscillator that can overcome the problems of the prior art due to trim effect error.

SUMMARY OF THE PREFERRED EMBODIMENT(S)

It is a feature of the invention to provide an oscillator that has a trim effect compensation circuit.

A further feature of the invention is to provide an oscillator assembly that includes a voltage controlled crystal oscillator that produces a stable reference frequency. The voltage controlled crystal oscillator has a terminal connected to an electronic frequency adjust voltage. A temperature compensation circuit is in communication with the voltage controlled crystal oscillator. The temperature compensation circuit is adapted to provide a temperature compensation voltage to the voltage controlled crystal oscillator. The temperature compensation voltage allows the voltage controlled crystal oscillator to maintain the stable reference frequency as the temperature around the oscillator assembly varies. A trim effect compensation circuit is connected between the temperature compensation circuit and the terminal. The trim effect compensation circuit is adapted to adjust the temperature compensation voltage in response to a change in the electronic frequency adjust voltage.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The invention will be described with additional specificity and detail through the accompanying drawings.

DETAILED DESCRIPTION OF THE PREFERRED EMBODIMENT(S)

Figure 4:
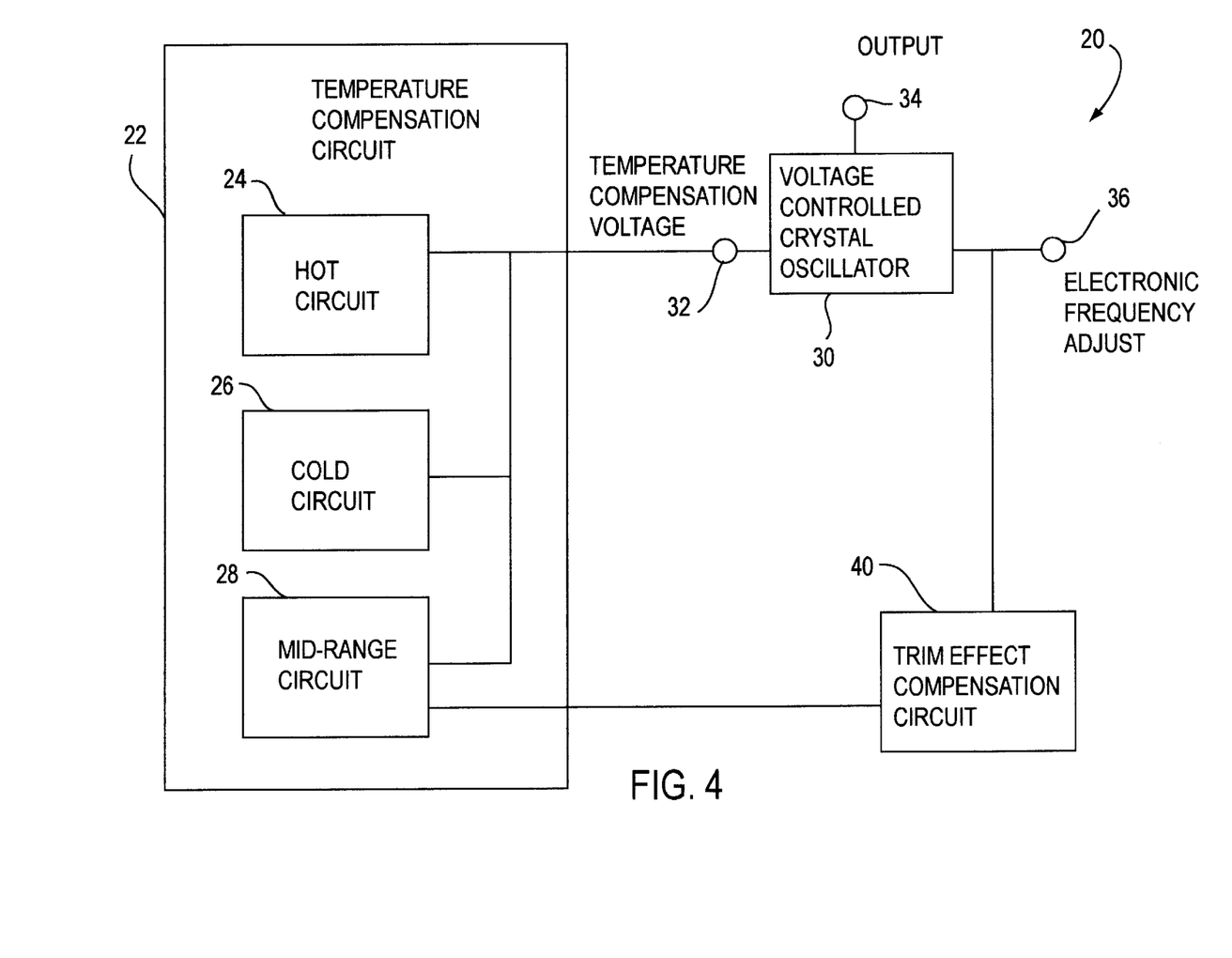
FIG. 4 is a diagrammatic view of the preferred embodiment of the invention.

Referring to FIG. 4, an oscillator assembly 20 having a trim effect compensation circuit is shown. Oscillator assembly 20 comprises a temperature compensation circuit 22, a voltage controlled crystal oscillator 30 and a trim effect compensation circuit 40. Temperature compensation circuit 22 includes a hot compensation circuit 24, a cold circuit 26 and a mid-range circuit 28, all of which are tied together to a terminal 32. The hot circuit 24, cold circuit 26 and mid-range circuit 28 are typically thermistors that are sensitive to each temperature range. Voltage controlled crystal oscillator 30 provides a stable reference frequency output signal at output terminal 34. Temperature compensation circuit 22 generates a temperature compensation voltage that is applied to voltage controlled crystal oscillator 30 at terminal 32. The temperature compensation voltage corrects the output frequency against the effects of temperature. The result is that for any temperature within the design range of the oscillator, the output frequency remains fairly constant.

Voltage controlled crystal oscillator 30 has an electronic frequency adjust (EFA) terminal 36. The electronic frequency adjust terminal receives an electronic frequency adjust voltage that can be used to trim or adjust the nominal output frequency. In most cases where frequency adjustment is required, it is most cost effective to design-in an electronic frequency adjust circuit internal to the voltage controlled crystal oscillator. This circuit is conventional on many voltage controlled crystal oscillators. Usually the EFA terminal is connected to a digital to analog converter voltage source or a potentiometer connected to a voltage source.

Trim effect compensation circuit 40 is connected between the electronic frequency adjust voltage terminal 36 and the mid-range circuit 28. The trim effect compensation circuit 40 feeds a portion of the tuning or electronic frequency adjust correction voltage back to the temperature compensation circuit to compensate for the trim effect error phenomenon.

Three Negative Temperature Coefficient thermistors such in circuits 24, 26 and 28 are required to compensate the cubic shaped frequency vs. temperature characteristic of an AT cut crystal oscillator. In a conventional three thermistor compensating network, one of the thermistors is biased so that it affects the output voltage over the entire temperature range, being fairly linear throughout the room-temperature region. This being the mid-range circuit 28. Another thermistor affects primarily the cold end of the temperature range, and the third one primarily the hot temperature region. Trim effect error results in an effective rotation of the crystal curve (and therefore the resultant compensated frequency vs. temperature characteristic) over the entire temperature range. FIG. 2 shows the typical rotation of the frequency vs. temperature characteristic of a standard TCXO that occurs as the center frequency is incrementally trimmed + and − about 12 ppm from nominal. It can be seen that the slope of the entire curve is progressively skewed as the amount of shift is increased or decreased. If a straight line is fit through each curve and the slopes of the lines are plotted vs. the tuning voltage, (which is proportional to the amount of frequency shift or trim), it can be seen in FIG. 3 that a very linear, well behaved function is obtained. It was recognized that if the effective slope of the mid-range thermistor could be adjusted proportional to the amount of frequency trim or shift that has occurred, it would be possible to therefore adjust the overall rotation of the temperature curve in relation to the amount of frequency pull or shift that had been imparted.

With a traditional temperature compensation circuit 22 using thermistors, the effective slope of each thermistor is adjusted by selecting precision fixed resistors. It is not practical with this configuration to dynamically adjust the slope of the individual thermistors.

As was shown previously in FIGS. 2 and 3, the trim effect error changes linearly as the amount of trim or electronic frequency adjust voltage is increased. The magnitude of the trim is directly proportional to the EFA voltage. Trim effect compensation circuit 40 cancels out the trim effect skew that normally occurs by feeding back a certain percentage of the EFA voltage in the correct polarity to the mid-range circuit 28.

Figure 5:
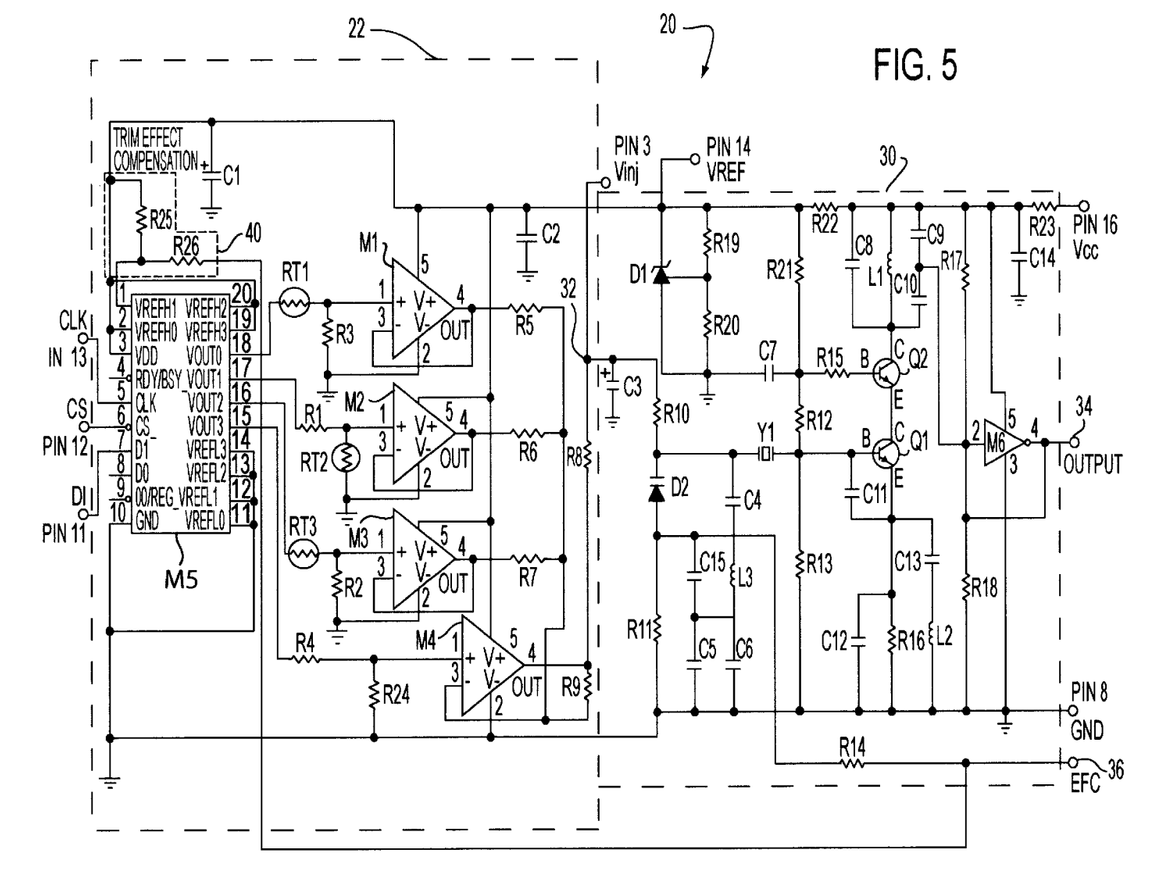
FIG. 5 is a detailed schematic diagram of the invention.

FIG. 5 shows a detailed schematic diagram of an oscillator assembly 20 using trim effect compensation circuit 40. A conventional voltage controlled crystal oscillator 30 is shown in a Colpitts configuration. Oscillator 30 includes a crystal Y1, an oscillator transistor Q1 and an amplifier transistor Q2, and a variable capacitance varactor diode D2. M6 is a CMOS output buffer that connects to output terminal 34. Inductor L2 and capacitor C13 form a third overtone trap. Capacitors C11, C12 and resistor R16 in conjunction with transistor Q1 form a negative resistance generator. Capacitors C4. C5, C6, C15 and inductor L3 adjust the crystal frequency. Diode D1 and resistors R19 and R20 set a reference voltage. Inductor L1 and capacitors C8, C10 and C9 form a tank circuit.

Temperature compensation circuit 22 includes a hot compensation circuit 24, a cold circuit 26 and a mid-range circuit 28, all of which are tied together to terminal 32. Hot circuit 24 includes a thermistor RT1, a resistor R3 and a voltage follower buffer M1. Cold circuit 26 includes a thermistor RT3, a resistor R2 and a voltage follower buffer M3. Mid-range circuit 28 includes a thermistor RT2 a resistor R1 and a voltage follower buffer M2. M4 is a summing amplifier that sums the outputs from M1, M2 and M3.

A quad digital to analog converter (DAC) M5 has output pins connected to each of the three thermistors RT1, RT2 and RT3. M5 is a quad digital to analog converter (DAC) that outputs an analog signal to each thermistor. One of the digital to analog converters sets the offset voltage on the summing amplifier M4. The Vref inputs to the DAC are a constant reference voltage. Pins 11, 12 and 13 of M5 are connected to an external digital source such as a test system computer during manufacturing. The system computer sets the DAC voltage levels during manufacturing. The DAC voltage levels provided to thermistors RT1, RT2 and RT3 then remain constant. The DAC sets the output voltage to the thermistors.

Trim effect compensation circuit 40 includes resistors R25 and R26. The compensation is implemented by feeding back to the mid-range thermistor RT1 a slope adjustment voltage that is a fraction of the EFA tuning voltage. Initially, R25 is selected to calibrate and set the endpoints of the tuning range. A single varactor diode D2 is used in the circuit to perform multiple functions. The final compensating voltage is applied to the cathode of D2 to correct for temperature drift. A lower level voltage from the EFA pin is applied to the anode for performing the center frequency adjustment. The ratio of R25 to R14 determines the amount of voltage applied to the anode of D2 and therefore the frequency tuning range. The amount of trim effect compensation voltage that is applied to the temperature compensation circuit is determined by R26. The ratio of R26 to the input impedance of the temperature compensation circuit 22 controls how much of the EFA voltage is fed back.

As can be seen, it is very straightforward to add the trim effect compensation circuit 40 to an oscillator. It only requires the addition of two resistors and the changing of a few connections.

Figure 6:
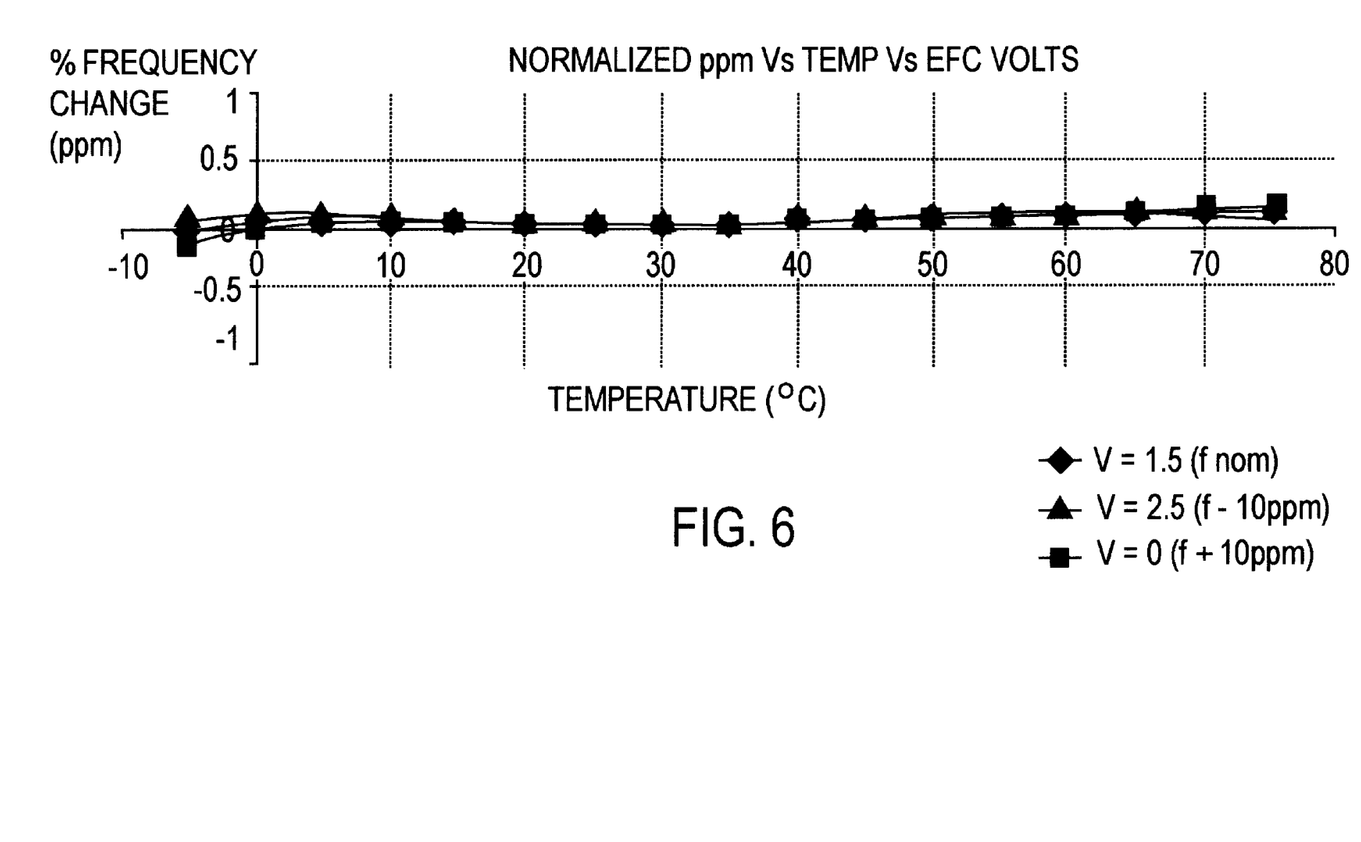
FIG. 6 is a graph of trim effect error for an oscillator using the trim effect compensation circuit of the present invention.

FIG. 6 shows the results of using trim effect compensation circuit 40. Using trim effect compensation circuit 40 results in approximately a 10 times reduction in frequency change with temperature changes at various EFA adjustments. The trim effect compensation circuit enables a whole new class of oscillator applications to be addressed with a temperature compensated crystal oscillator (TCXO). In the past, telecom systems that required true "Stratum 3" stability were usually designed with ovenized oscillators in order to meet the ±0.37 ppm holdover specification for the life of the part. By using a trim effect compensation circuit with a TCXO, these specifications can be met, thus removing a roadblock that has limited the application of TCXO's since their inception some 50 years ago.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator assembly, comprising:
   a) a voltage controlled crystal oscillator operable to produce a stable reference frequency, the voltage controlled crystal oscillator having a terminal connected to an external electronic frequency adjust voltage;
   b) a temperature compensation circuit in communication with the voltage controlled crystal oscillator, the temperature compensation circuit adapted to provide a temperature compensation voltage to the voltage controlled crystal oscillator, the temperature compensation voltage allowing the voltage controlled crystal oscillator to maintain the stable reference frequency as the temperature around the oscillator assembly varies; and
   c) a trim effect compensation circuit connected between the temperature compensation circuit and the terminal, the trim effect compensation circuit receiving the electronic frequency adjust voltage and providing a compensation signal to the temperature compensation circuit that is a portion of the electronic frequency adjust voltage, the trim effect compensation circuit adapted to adjust the temperature compensation voltage in response to a change in the electronic frequency adjust voltage.

2. The oscillator assembly according to claim 1, wherein the temperature compensation circuit further includes a hot circuit, a cold circuit and a mid-range circuit, the trim effect compensation circuit connected between the mid-range circuit and the terminal, the trim effect compensation circuit adjusting the response of the mid-range circuit in proportion to the electronic frequency adjust voltage.

3. The oscillator assembly according to claim 2, wherein the trim effect compensation circuit prevents trim effect error.

4. The oscillator assembly according to claim 3, wherein the trim effect compensation circuit includes a first resistor and a second resistor.

5. The oscillator assembly according to claim 4, wherein the first resistor is connected between the terminal and the mid-range circuit.

6. The oscillator assembly according to claim 5, wherein the second resistor is connected between the first resistor and a source of power.

7. The oscillator assembly according to claim 6, wherein the first resistor adjusts the amount of trim effect compensation that is applied to the temperature compensation circuit.

8. The oscillator assembly according to claim 7, wherein the second resistor adjusts the limits of the electronic frequency adjust voltage.

9. An oscillator, comprising:
   a) a voltage controlled oscillator operable to produce a stable reference frequency, the voltage controlled oscillator connected to an external electronic frequency adjust voltage, the electronic frequency adjust voltage adapted to correct the stable reference frequency for aging effects;
   b) a temperature compensation circuit connected to the voltage controlled oscillator, the temperature compensation circuit adapted to provide a temperature compensation voltage to the voltage controlled oscillator, the temperature compensation voltage allowing the voltage controlled oscillator to maintain the stable reference frequency as the temperature around the oscillator assembly varies, the temperature compensation circuit having a hot temperature circuit, a cold temperature circuit and a mid-range temperature circuit, the hot temperature circuit, the cold temperature circuit and the mid-range temperature circuit all being in communication with each other; and
   c) a trim effect compensation circuit connected between the mid-range circuit and the terminal, the trim effect compensation circuit receiving the electronic frequency adjust voltage and providing a compensation signal to the mid-range circuit that is a portion of the electronic frequency adjust voltage, the trim effect compensation circuit adapted to adjust the temperature compensation voltage in response to a change in the electronic frequency adjust voltage, the trim effect compensation circuit preventing trim effect error.

10. The oscillator assembly according to claim 9, wherein the trim effect compensation circuit includes a first resistor and a second resistor.

11. The oscillator assembly according to claim 10, wherein the first resistor adjusts the amount of trim effect compensation that is applied to the temperature compensation circuit.

12. The oscillator assembly according to claim 10, wherein the second resistor adjusts the limits of the electronic frequency adjust voltage.

13. A method of operating an oscillator to provide a reference frequency signal comprising:
   a) providing an oscillator;

b) generating the reference frequency signal from the oscillator;
c) providing a temperature compensation circuit connected to the oscillator;
d) generating a temperature compensation voltage from the temperature compensation circuit;
e) providing an electronic frequency adjust voltage;
f) providing a trim effect compensation circuit connected between the electronic frequency adjust voltage and the temperature compensation circuit; and
g) feeding back a portion of the electronic frequency adjust voltage to the temperature compensation circuit in order to compensate for trim effect error.

* * * * *